(12) United States Patent
Bae

(10) Patent No.: US 7,709,375 B2
(45) Date of Patent: May 4, 2010

(54) SEMICONDUCTOR DEVICE INCLUDING CONTACT PATTERN AND METHOD FOR FABRICATING THE SAME

(75) Inventor: Jae Jun Bae, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 80 days.

(21) Appl. No.: 11/967,334

(22) Filed: Dec. 31, 2007

(65) Prior Publication Data

US 2008/0227290 A1    Sep. 18, 2008

(30) Foreign Application Priority Data

Mar. 16, 2007    (KR) .................. 10-2007-0026139

(51) Int. Cl.
*H01L 21/4763*    (2006.01)
(52) U.S. Cl. .............................. 438/643; 257/E21.584
(58) Field of Classification Search ................ 438/627, 438/639, 666, 643; 257/E21.584
See application file for complete search history.

(56) References Cited

U.S. PATENT DOCUMENTS

| 5,801,096 | A | * | 9/1998 | Lee et al. | ............ | 438/636 |
| 6,448,649 | B1 | * | 9/2002 | Lee et al. | ............ | 257/758 |
| 2004/0185657 | A1 | | 9/2004 | Lee et al. | ............ | 438/643 |

FOREIGN PATENT DOCUMENTS

| KR | 10-2002-0066586 | 8/2002 |
| KR | 10-2004-0013293 | 2/2004 |

* cited by examiner

*Primary Examiner*—W. David Coleman
(74) *Attorney, Agent, or Firm*—Marshall, Gerstein & Borun LLP

(57) ABSTRACT

A method of fabricating a semiconductor device includes forming a barrier film over a semiconductor substrate and over a gate disposed on the substrate; forming a metal layer over the barrier film; selectively etching the metal layer and the barrier film to form a contact pattern between the gates; forming a spacer over a sidewall of the contact pattern; forming an interlayer insulating film over the contact pattern and the gate; and polishing the interlayer insulating film to expose the contact pattern.

10 Claims, 6 Drawing Sheets

SEMICONDUCTOR DEVICE INCLUDING CONTACT PATTERN AND METHOD FOR FABRICATING THE SAME

CROSS-REFERENCE TO RELATED APPLICATION

The priority of Korean patent application number 10-2007-0026139, filed on Mar. 16, 2007, which is incorporated by reference in its entirety, is claimed.

BACKGROUND OF THE INVENTION

1. Field of the Disclosure

The disclosure relates to a semiconductor device and, to a method for fabricating the device.

2. Brief Description of Related Technology

Due to high integration of semiconductor devices, a contact area between a bit line and an active region of a semiconductor substrate is reduced. This reduction makes it is difficult to contact the bit line with the contact area. In the manufacturing process of semiconductor devices, a landing plug contact is formed for stable electric connection between top and bottom patterns. The active region of the semiconductor substrate is electrically connected to the bit line through the landing plug contact. When the bit line is formed, an interlayer insulating film is etched, and a bit line contact process is performed to expose the landing plug contact.

A resistance is increased through a bit line contact and a landing plug contact, and a flowing current amount is decreased to generate a Time to Write and Read (tWR) fail. In the tWR fail, a resistance is increased with resistance increase of the landing plug contact while data stored in a capacitor of a memory cell are transmitted into a bit line so that the data stored in the cell are not recognized in the bit line.

FIGS. 1a to 1e are cross-sectional diagrams illustrating a conventional method for forming a bit line contact of a semiconductor device. Referring to FIG. 1a a gate structure 125 are formed over a semiconductor substrate 100 including a device isolation structure 105. The gate structure 125 having a deposition structure including a gate insulating film (not shown), a gate conductive pattern 110, a gate metal pattern 115 and a gate hard mask pattern 120. The gate conductive pattern 110 includes a polysilicon layer, and the gate metal pattern 115 includes a tungsten silicide layer. The gate hard mask pattern 120 includes a nitride film. A spacer 130 is formed at a sidewall of the gate structure 125. The spacer 130 includes one selected from the group consisting of an oxide film, a nitride film, and combinations thereof.

Referring to FIG. 1b, an interlayer insulating film (not shown) is formed over the semiconductor substrate 100 and the gate structure 125 including the spacer 130, and a landing plug contact region is etched to form a landing plug contact hole (not shown). A polysilicon layer (not shown) is formed to fill the landing plug contact hole, and planarized to expose the gate hard mask pattern 120, thereby obtaining a landing plug contact 140.

Referring to FIG. 1c, an insulating film 145 for bit line contact is formed over the gate hard mask pattern 120, the landing plug contact 140 and the interlayer insulating film 135. The insulating film 145 includes one selected from the group consisting of high temperature oxide (HTO), tetraethoxysilane (TEOS), undoped silicate glass (USG), borophosphosilica glass (BPSG), and combinations thereof. A photoresist pattern 150 that defines a bit line contact region is formed over the insulating film 145.

Referring to FIG. 1d, the insulating film 145 is etched with the photoresist pattern 150 as an etching mask to form a bit line contact hole 155 that exposes the landing plug contact 140. The etching process for forming the bit line contact hole 155 is performed by a dry etching method. The photoresist pattern 150 is removed.

Referring to FIG. 1e, a barrier film 160 is formed over the landing plug contact 140 and the insulating film 145 including the bit line contact hole 155. A bit line 170 is formed to fill the bit line contact hole 155 with a bit line conductive layer 165. The barrier film 160 includes one selected from the group consisting of a titanium film, a titanium nitride film, and combinations thereof.

In the conventional method, a bit line contact and a landing plug contact are formed to increase a resistance between two interfaces. An additional process for forming a landing plug contact complicates a process step. A signal of the bit line passes through the bit line contact and the landing plug contact to increase a resistance. As a result, a current amount decreases to generate a tWR fail. As a design rule of the device is decreased, an overlap margin between the active region and the bit line is decreased so that a contact area is reduced.

SUMMARY OF THE INVENTION

Various embodiments of the invention are directed at a semiconductor device and a method for fabricating the same. The method does not include forming a landing plug contact to connect an active region to a bit line contact; but, instead, forming a contact to connect an active region directly to a bit line. Also, the contact includes a metal layer to develop a device used in a high speed operation. Due to the decrease of a design rule, an overlap margin and a device resistance characteristic can be improved.

According to an embodiment of the invention, a method of fabricating a semiconductor device includes forming a barrier film over a semiconductor substrate and over a gate disposed on the substrate; forming a metal layer over the barrier film; selectively etching the metal layer and the barrier film to form a contact pattern between the gates; forming a spacer over a sidewall of the contact pattern; forming an interlayer insulating film over the contact pattern and the gate; and polishing the interlayer insulating film to expose the contact pattern.

According to another embodiment of the invention, a semiconductor device includes a gate disposed on a semiconductor substrate, a barrier film disposed on sidewalls of the gate and the semiconductor substrate, a contact layer formed at an interface between the barrier film and the semiconductor substrate, a contact pattern disposed in a space between the gates and electrically connected with the contact layer, and an interlayer insulating film disposed between the contact patterns, the interlayer insulating film electrically isolating the contact patterns from each other.

Additional features of the invention may become apparent to those skilled in the art from a review of the following detailed description, taken in conjunction with the drawings and the appended claims.

BRIEF DESCRIPTION OF THE DRAWINGS

For a more complete understanding of the disclosure, reference should be made to the following detailed description and accompanying drawings wherein.

Figure 1A:
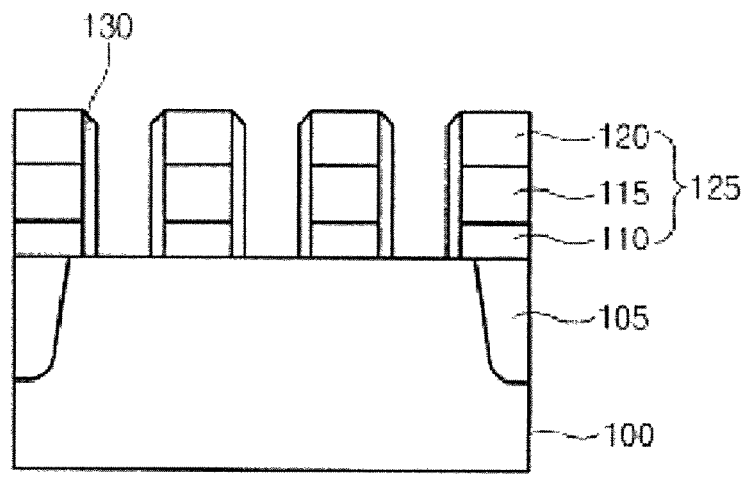
FIGS. 1a to 1e are cross-sectional diagrams illustrating a conventional method for fabricating a semiconductor device.
Figure 1B:
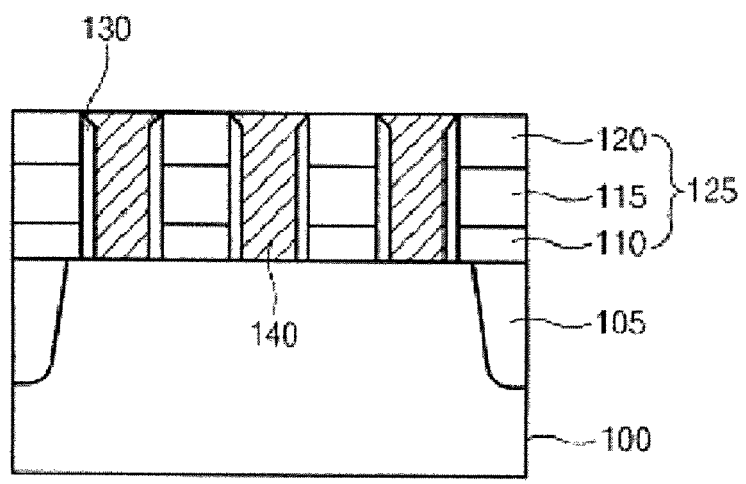
Figure 1C:
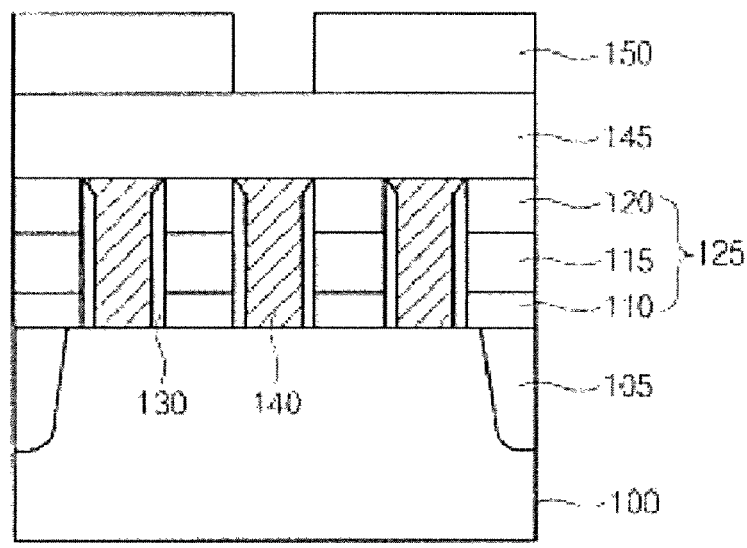
Figure 1D:
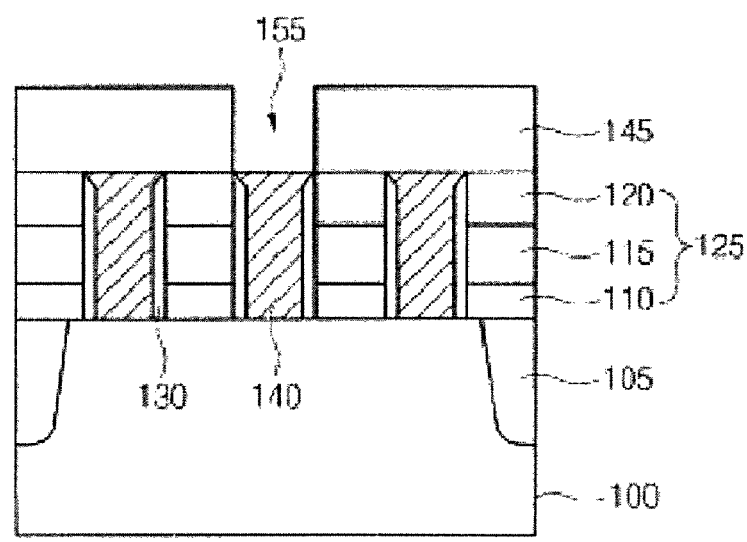
Figure 1E:
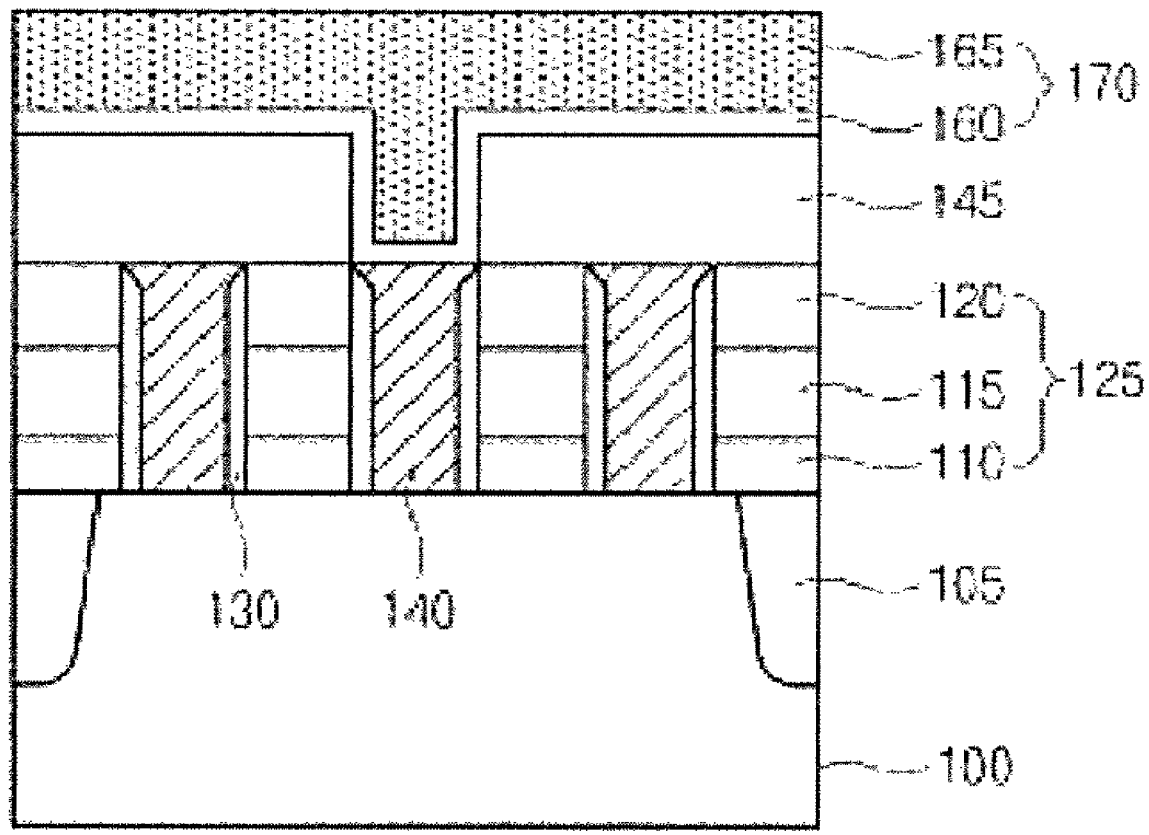

While the disclosed method and device are susceptible of embodiments in various forms, there are illustrated in the drawings (and will hereafter be described) specific embodiments of the invention, with the understanding that the disclosure is intended to be illustrative, and is not intended to limit the invention to the specific embodiments described and illustrated herein.

DETAILED DESCRIPTION OF THE PREFERRED EMBODIMENTS

A semiconductor device includes a contact to connect an active region to a bit line. The contact includes a metal layer to improve an operating characteristic of the device.

FIGS. 2a to 2f are cross-sectional diagrams illustrating a method for fabricating a semiconductor device according to an embodiment of the invention. A structure including a gate insulating film (not shown), a gate conductive layer 210, a gate metal layer 215 and a gate hard mask layer 220 is formed over a semiconductor substrate 200 including a device isolating structure 205 that defines an active region. The gate conductive layer 210 includes a polysilicon layer, and the gate metal layer 215 includes a tungsten silicide layer. The gate hard mask layer 220 includes a nitride film. The deposition structure is selectively etched to form a gate 225. A spacer 227 is formed at a sidewall of the gate 225. A space between the two gates 225 formed over the active region is defined by a bit line contact region. A space between the gate 225 over the adjacent active region and the gate 225 formed over the device isolating structure 205 is defined by a storage node contact region.

Figure 2A:
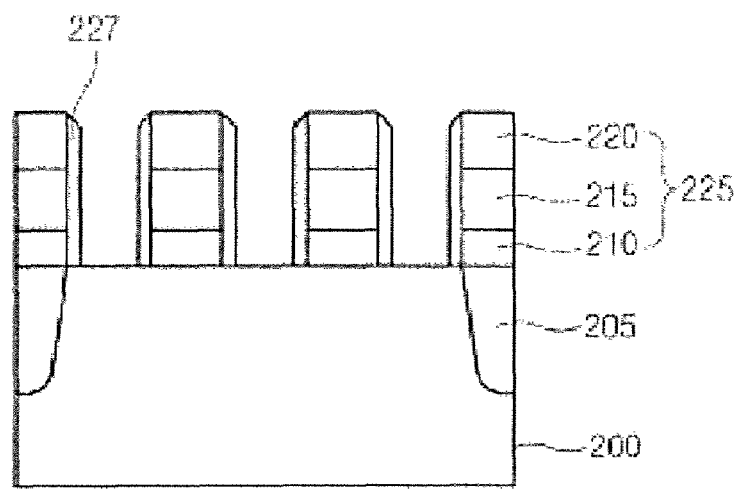
FIGS. 2a to 2f are cross-sectional diagrams illustrating a method for fabricating a semiconductor device according to an embodiment of the invention.

With continued reference to FIG. 2a, a barrier film 230 is formed over the semiconductor substrate 200 including the gate 225. The barrier film 230 includes a layer formed of a material selected from the group consisting of titanium (Ti), titanium nitride (TiN), and combinations thereof. A rapid thermal annealing (RTA) process is performed to form a contact layer 233 on the interface of the exposed semiconductor substrates 200 and the barrier films 230. When the RTA process is performed under an inert gas atmosphere, such as nitrogen ($N_2$), argon (Ar) etc., silicon (Si) in the semiconductor substrate 200 and Ti in the barrier film 230 react to form the contact layer 233 of titanium silicide (TiSi). The Ti atoms of the barrier film 230 are in-diffused into the semiconductor substrate 200, and the Si atoms of the semiconductor substrate 200 are out-diffused into the barrier film 230. A contact layer 233 including TiSi is formed on the interface of the semiconductor substrate 200 exposed between the gates 225 and the barrier film 230. Preferably, the contact layer 233 is used as Ohmic contact. The RTA process increases adhesive property between the semiconductor substrate 200 and the barrier film 230, and prevents Schottky junction from occurring between the semiconductor substrate 200 and a subsequent metal which is formed over the semiconductor substrate 200.

Figure 2B:
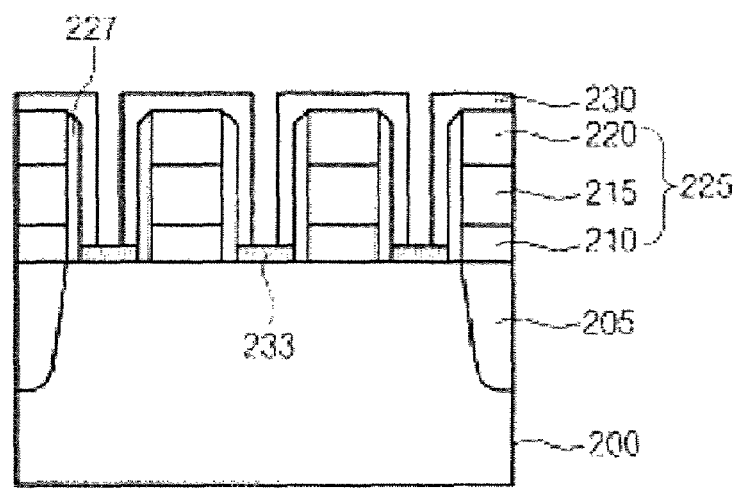
Figure 2C:
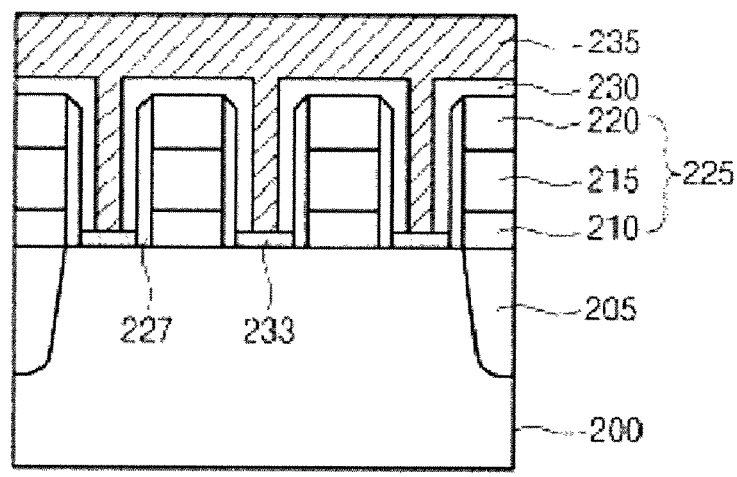
Figure 2D:
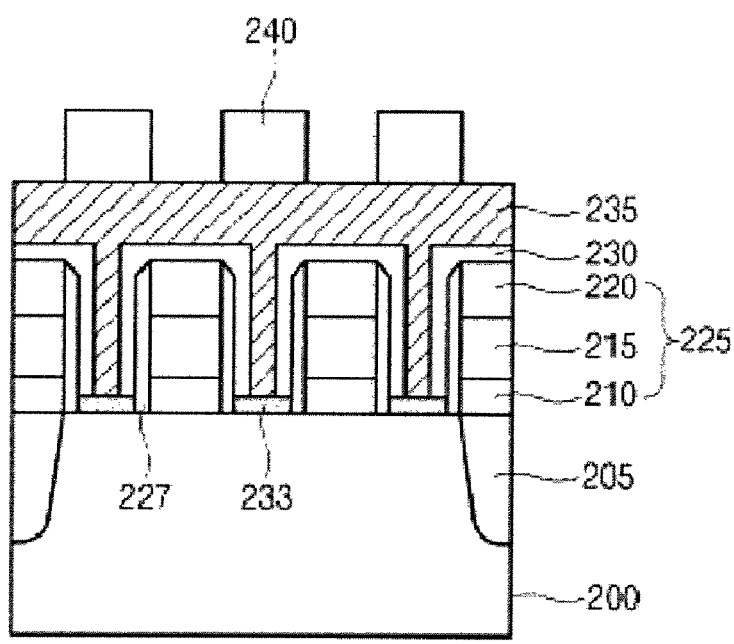

Referring to FIGS. 2b, 2c, and 2d, a metal layer 235 is formed over the barrier film 230. The metal layer 235 includes a tungsten layer. The metal layer 235 can be formed to have a height ranging from about 4000 Å to about 6000 Å from the semiconductor substrate 200. A photoresist film (not shown) is formed over the metal layer 235. The photoresist film is subject to an exposure process and a developing process to form a photoresist pattern 240. The photoresist film over a gate region (not shown) is removed and, thus, the photoresist pattern 240 remains over a bit line contact region and a storage node contact region.

Figure 2E:
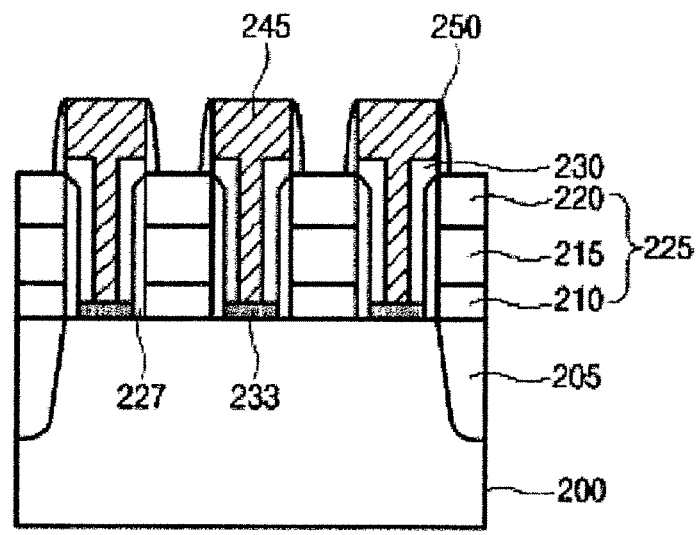
Figure 2F:
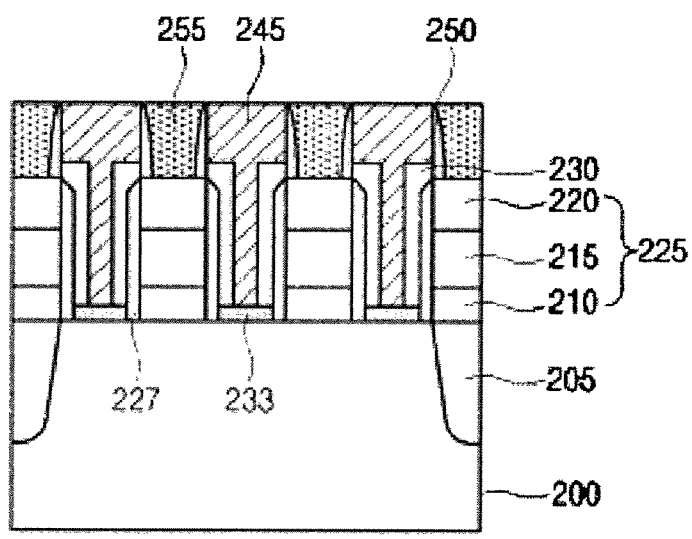

Referring to FIGS. 2e and 2f, the metal layer 235 and the barrier film 230 are selectively etched using the photoresist pattern 240 as a mask to form a hole exposing the gate, thereby forming a contact pattern 245. When the contact pattern 245 is formed, the metal layer 235 and the barrier film 230 over the gate are removed to expose the gate hard mask layer 220. After an insulating film (not shown) is formed over the contact pattern 245 and the gate 225, the insulating film is selectively etched to form a spacer 250 at a sidewall of the contact pattern 245. The spacer 250 can be formed of a nitride film. An etching process for forming the spacer 250 can be performed by an etch-back method. An interlayer insulating film 255 is formed over the gate hard mask layer 220, the contact pattern 245 and the spacer 250. The interlayer insulating film 255 is subject to planarization to expose the contact pattern 245, thereby the contact patterns 245 can be electrically connected with the contact layer 233. The interlayer insulating film 255 can be formed of a Boro-Phospho-Silica Glass (BPSG) oxide film 255. The planarization of the interlayer insulating film 255 can be performed by a Chemical Mechanical Polishing (CMP) method or an etch-back method.

As described above, according to an embodiment of the invention, a method for fabricating a semiconductor device does not include forming a landing plug contact to connect an active region to a bit line contact, but forming a contact to connect the active region directly to the bit line. The contact includes a metal layer to improve an operating characteristic of the device and an overlap margin resulting from reduction of the design rule of the device, thereby securing the contact area and improving a resistance characteristic of the device.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method of fabricating a semiconductor device, the method comprising:
    forming a barrier film over a semiconductor substrate and over a gate disposed on the substrate;
    forming a metal layer over the barrier film;
    selectively etching the metal layer and the barrier film to form a hole exposing the gate, and to form a contact pattern filling between the gates;
    forming a spacer over a sidewall of the contact pattern;
    forming an interlayer insulating film over the contact pattern and the gate; and
    polishing the interlayer insulating film to expose the contact pattern.

2. The method of claim 1, wherein the barrier film comprises a material selected from the group consisting of titanium (Ti), titanium nitride (TiN), and a combination thereof.

3. The method of claim 1, further comprising performing a Rapid Thermal Annealing (RTA) process on the barrier film to form a contact layer at an interface between the barrier film and the semiconductor substrate.

4. The method of claim 1, wherein the metal layer comprises a tungsten (W) layer.

5. The method of claim 1, wherein the metal layer has a thickness of about 4,000 Å to about 6,000 Å.

6. The method of claim 1, wherein the spacer comprises a nitride film.

7. The method of claim 1, wherein the interlayer insulating film comprises a boro-phospho-silicate glass (BPSG) film.

8. The method of claim 3, wherein the contact layer comprises a titanium silicide (TiSi) layer.

9. A semiconductor device comprising:

a gate disposed on a semiconductor substrate;

a barrier film disposed on sidewalls of the gate and the semiconductor substrate;

a contact pattern formed over, and electrically connected with, the semiconductor substrate, wherein the contact pattern fills between the gate and the gate is exposed by the contact pattern;

a spacer disposed on a sidewall of the contact pattern; and, an interlayer insulating film disposed between the contact patterns.

10. The method of claim 9, further comprising a contact layer formed at an interface between the barrier film and the semiconductor substrate.

* * * * *